(12) United States Patent
Niimi

(10) Patent No.: US 6,472,910 B2
(45) Date of Patent: Oct. 29, 2002

(54) ELECTRICAL LOAD DRIVING DEVICE

(75) Inventor: Yukihide Niimi, Chita-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/828,123

(22) Filed: Apr. 9, 2001

(65) Prior Publication Data

US 2001/0030557 A1 Oct. 18, 2001

(30) Foreign Application Priority Data

Apr. 12, 2000 (JP) .......................................... 2000-110978

(51) Int. Cl.[7] .............................................. H02H 3/087
(52) U.S. Cl. ....................................... 327/108; 361/93.3
(58) Field of Search ................................... 327/108, 109, 327/110, 111, 112, 530, 538, 543, 546, 77; 326/82, 83; 307/127, 131, 412; 361/93.1, 93.2

(56) References Cited

U.S. PATENT DOCUMENTS

| 4,736,267 A | * | 4/1988 | Karlmann et al. .......... 361/101 |
|---|---|---|---|
| 4,860,154 A | * | 8/1989 | Fazlollahi ................... 361/101 |
| 5,754,879 A | | 5/1998 | Johnston ...................... 712/39 |
| 5,757,213 A | | 5/1998 | Moller ........................ 327/108 |
| 5,757,214 A | * | 5/1998 | Stoddard et al. ............ 327/110 |
| 5,828,247 A | | 10/1998 | Moller et al. ............... 327/110 |
| 5,828,308 A | * | 10/1998 | Fukami ...................... 361/93.1 |
| 6,400,163 B1 | * | 6/2002 | Melcher et al. ............. 361/160 |

* cited by examiner

Primary Examiner—Timothy P. Callahan
Assistant Examiner—Terry L. Englund
(74) Attorney, Agent, or Firm—Nixon & Vanderhye P.C.

(57) ABSTRACT

An electrical load driving device is constructed to accurately detect an over-current state in either a high-side output mode or a low-side output mode irrespective of voltage fluctuations of a load power supply. The over-current is detected by a detection voltage which decreases from a battery voltage in proportion to a current flowing through an output transistor being compared with a determination voltage in the high-side output mode. It is detected by a second detection voltage which increases from a ground potential in proportion to the current flowing through the output transistor being compared with a determination voltage in the low-side output mode.

10 Claims, 3 Drawing Sheets

ELECTRICAL LOAD DRIVING DEVICE

CROSS REFERENCE TO RELATED APPLICATION

This application is based on and incorporates herein by reference Japanese patent application No. 2000-110978 filed Apr. 12, 2000.

BACKGROUND OF THE INVENTION

This invention relates to an electrical load driving device having an output transistor which passes a driving current through an electrical load in response to a driving signal from outside. Particularly, this invention relates to an electrical load driving device whose output mode can be switched between a high-side output mode and a low-side output mode.

A vehicle electronic control unit such as an engine control unit or a transmission control unit mounted in an automobile controls respective control objects by driving various electrical loads such as relays and solenoids in accordance with the running state of the vehicle. To each electrical load, depending on the type and the purpose of the load, the electronic control unit uses one of two driving modes to supply a driving current, that is, a high-side driving mode and a low-side driving mode.

In conventional vehicle electronic control units, only one driving circuit (high-side driving circuit or low-side driving circuit) compatible with either one of the high-side and the low-side driving modes is provided on a circuit board. Consequently, when the driving mode of the electrical load is changed, large changes in hardware is necessitated.

To overcome this, U.S. Pat No. 5,828,247 proposes an electrical load driving device which is capable of switching its output mode between the high-side output mode and the low-side output mode. With this kind of electrical load driving device, output modes can be set freely to either the high-side output mode or the low-side output mode, and changes in the driving modes of electrical loads can be accommodated flexibly.

Generally, in a driving device provided in an electronic control unit for supplying a driving current to an electrical load, if the electrical load becomes shorted and an over-current passes through an output transistor of the driving device, it is necessary for a failsafe measure to be taken such as detecting this abnormality and forcibly turning off the output transistor.

In an automotive vehicle, a storage battery is used as a load power supply source of the driving current to the load. The voltage of the battery fluctuates. Consequently, an over-current detecting circuit which can detect that the current flowing through the output transistor becomes excessive even if the voltage of the load power supply fluctuates is necessary.

Thus, to realize a practical electrical load driving device which switches an output mode between the high-side output mode and the low-side output mode, the over-current detecting circuit is required to detect correctly that the current flowing through an output transistor has become excessive whether the output mode is set to the high-side output mode or the low-side output mode and even if the voltage of the load power supply fluctuates.

SUMMARY OF THE INVENTION

It is therefore an object of the present invention to provide an electrical load driving device which can detect correctly when the output transistor is in an over-current state, irrespective of a high-side or a low-side output mode or voltage fluctuations of a load power supply.

According to the present invention, an electrical load driving device is constructed to detect an over-current state of its output transistor irrespective of its operation mode, that is, in a high-side output mode or a low-side output mode, and irrespective of voltage fluctuations of a load power supply. In this device, when the output transistor is made to function as high-side driving means, a boosted voltage higher than a battery voltage is supplied to the gate of the output transistor in response to a driving signal. When the output transistor is made to function as low-side driving means, the battery voltage VB is supplied to the gate of the output transistor in response to the driving signal. In the high-side output mode, an over-current detection is carried out by a first detection voltage which decreases from the battery voltage in proportion to the current flowing through the output transistor being compared with a first determination voltage also referenced to the battery voltage. In a low-side output mode, the over-current detection is carried out by a second detection voltage which increases from a ground potential in proportion to the current flowing through the output transistor being compared with a second determination voltage also referenced to the ground potential.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
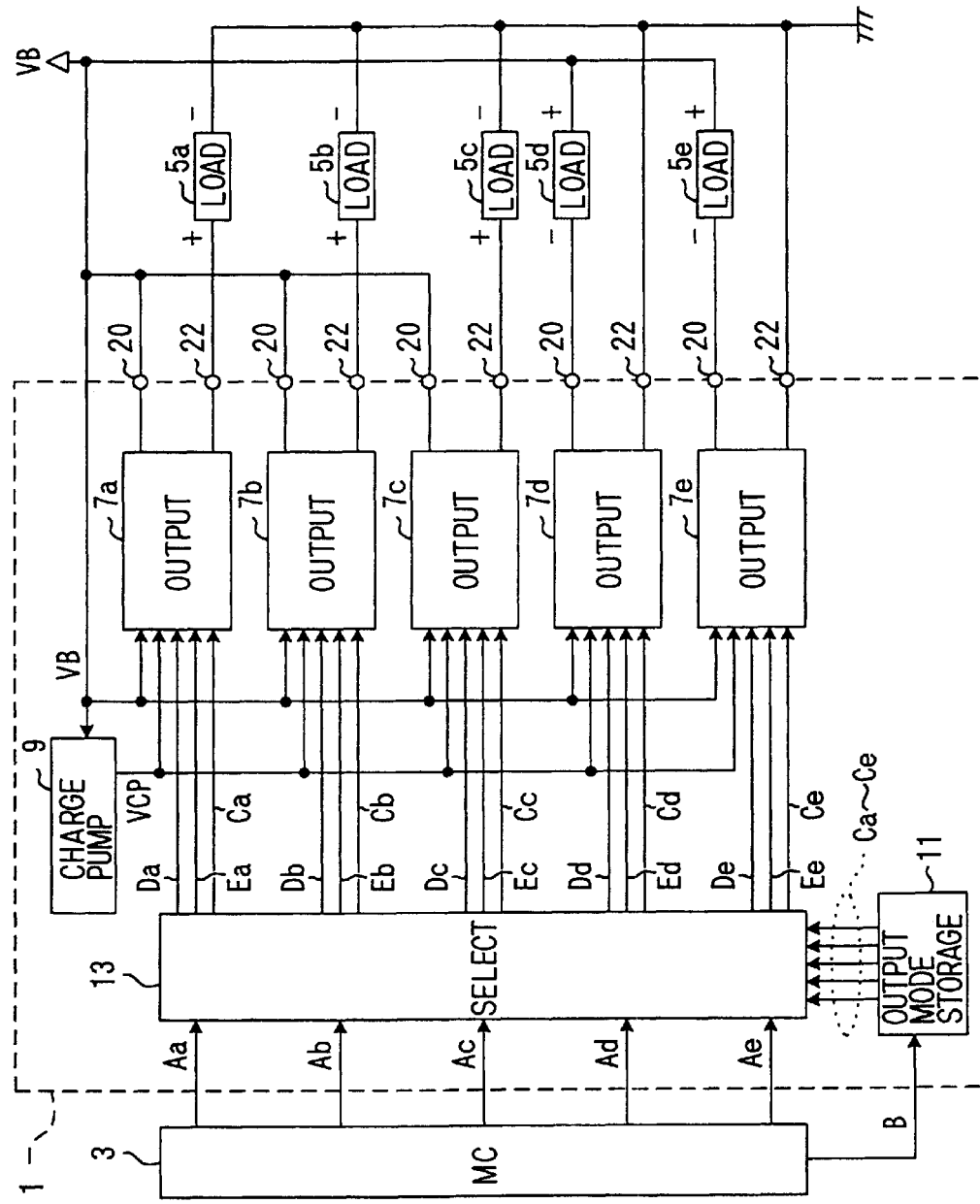
FIG. 1 is a circuit diagram showing an electrical load driving device according to an embodiment of the present invention.

Referring to FIG. 1, an electrical load driving device 1 according to an embodiment has a microcomputer (MC) 3 in a vehicle electronic control unit for controlling, for example, and engine or a transmission of an automobile. In accordance with a plurality of driving signals Aa through Ae outputted from the microcomputer 3, the electrical load driving device 1 passes driving currents through electrical loads 5a through 5e such as relays and solenoids corresponding to these driving signals Aa through Ae. The electrical load driving device 1 is made as a single semi-conductor integrated circuit (IC).

The number of loads 5a through 5e to be driven by the electrical load driving device 1 is five. In the following explanation, when no distinction is to be made among the loads 5a through 5e, reference numeral 5 will be used for any of these loads. Each of the driving signals Aa through Ae outputted from the microcomputer 3 is high-active, and a current is passed through the load 5 when the respective driving signal is high-level.

The electrical load driving device 1 has five output circuits 7a through 7e, a charge pump circuit 9, an output mode storage circuit 11 and a selector 13. The output circuits 7a through 7e are for passing a current through the load 5 in either a high-side output mode or a low-side output mode. The charge pump circuit 9 is for boosting a battery voltage (high-potential side of a load power supply) VB. That is, the circuit 9 boosts the voltage VB of the positive terminal of the battery to about twice the battery voltage VB and outputs this boosted voltage VCP. The output mode storage circuit 11 is for storing output modes to be employed by the output circuits 7a through 7e, in accordance with a command signal B outputted by the microcomputer 3 onstart-up. The selector 13 is for causing the output circuits 7a through 7e to operate in the output mode stored in the output mode storage circuit 11 in accordance with the driving signals Aa through Ae from the microcomputer 3.

The command signal B outputted from the microcomputer 3 to the output mode storage circuit 11 is made up of bits respectively corresponding to the output circuits 7a through 7e. It is data of five bits, wherein the bit value "1" indicates the high-side output mode and "0" indicates the low-side output mode.

The output mode storage circuit 11 has a semiconductor memory such as a volatile register. It stores the bits of the command signal B from the microcomputer 3 as output modes to be employed by the output circuits 7a through 7e and outputs signals of these stored bits to the selector 13 as output mode setting signals Ca through Ce respectively corresponding to the output circuits 7a through 7e.

The selector 13, on the basis of the driving signals Aa through Ae from the microcomputer 3 and the output mode setting signals Ca through Ce from the output mode storage circuit 11, outputs first driving command signals Da through De for high-side output mode operation and second driving command signals Ea through Ee for low-side output mode operation to the output circuits 7a through 7e. The selector 13 also outputs the output mode setting signals Ca through Ce from the output mode storage circuit 11 to the respective output circuits 7a through 7e as switching signals for switching over-current detecting circuits.

In FIG. 1, symbols a through e appended to the reference numerals of the different signals indicate to which of the output circuits 7a through 7e the signals correspond.

The construction and the operation of the selector 13 will now be explained, using the part which outputs the first driving command signal Da, the second driving command signal Ea and the output mode setting signal Ca to the output circuit 7a.

Figure 2:
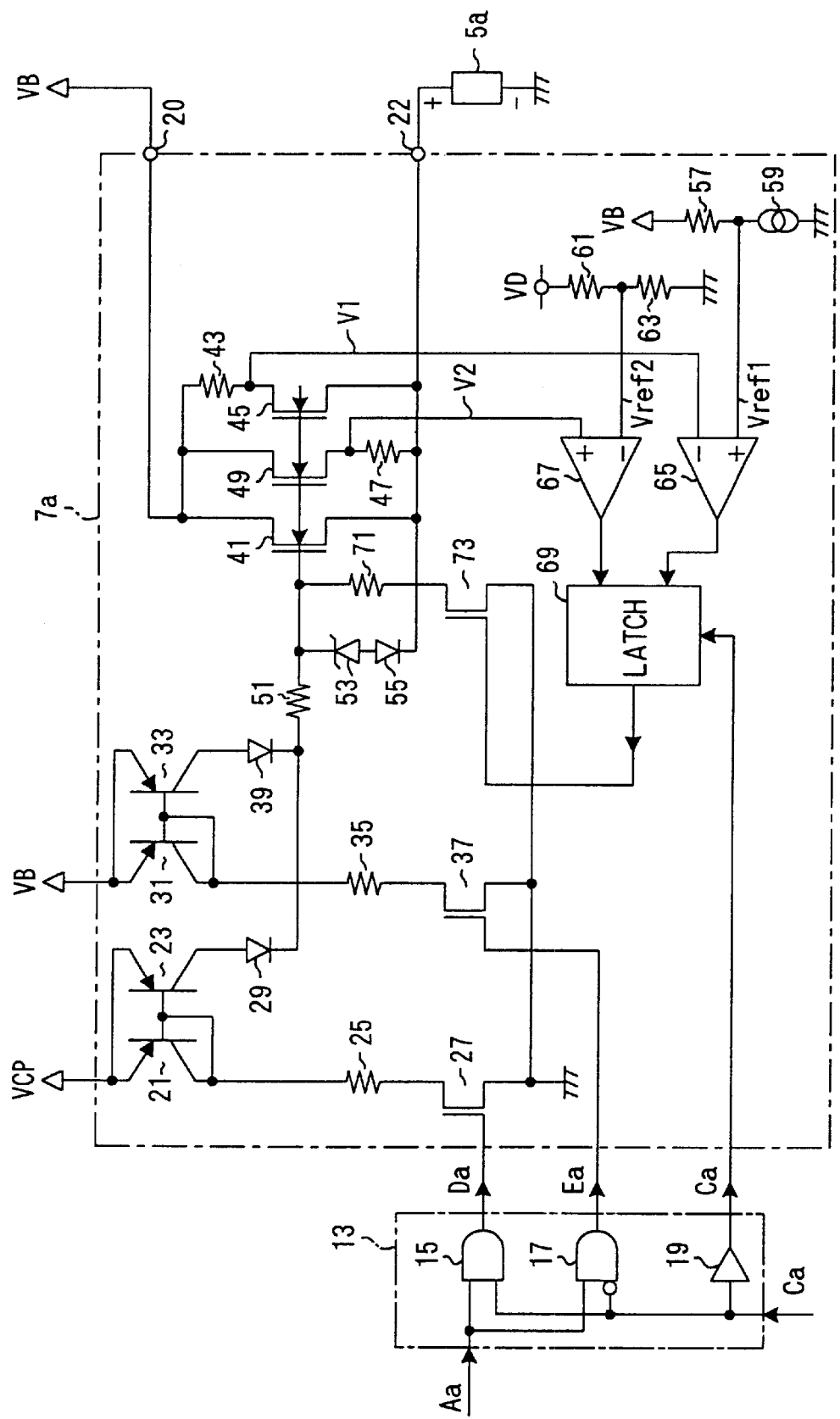
FIG. 2 is a circuit diagram showing an output circuit used in the embodiment to operate in a high-side output mode.

As shown in FIG. 2, this part of the selector 13 has an AND gate 15, an AND gate 17 and a buffer 19. The AND gate 15 is for outputting to the output circuit 7a as the first driving command signal Da a signal of the logical product of the driving signal Aa from the microcomputer 3 and the output mode setting signal Ca from the output mode storage circuit 11. The AND gate 17 is for outputting to the output circuit 7a as the second driving command signal Ea a signal of the logical product of the driving signal Aa and a signal obtained by logically inverting the output mode setting signal Ca. The buffer 19 is for directly outputting to the output circuit 7a the output mode setting signal Ca from the output mode storage circuit 11.

Accordingly, the first driving command signal Da, the second driving command signal Ea and the output mode setting signal Ca outputted from the selector 13 to the output circuit 7a operate as follows:

[1] First, when the output mode setting signal Ca from the output mode storage circuit 11 is high-level ("1") indicating the high-side output mode, the first driving command signal Da outputted from the selector 13 to the output circuit 7a assumes the same logical level as the driving signal Aa from the microcomputer 3. The second driving command signal Ea outputted from the selector 13 to the output circuit 7a is fixed at low-level.

[2] Conversely, when the output mode setting signal Ca from the output mode storage circuit 11 is low-level ("0") indicating the low-side output mode, the output mode setting signal Ca outputted from the selector 13 to the output circuit 7a is fixed at low-level. The second driving command signal Ea outputted from the selector 13 to the output circuit 7a assumes the same logical level as the driving signal Aa from the microcomputer 3.

[3] In either of the above cases [1] and [2], the output mode setting signal Ca from the output mode storage circuit 11 is outputted from the selector 13 to the output circuit 7a with its logical level unchanged.

Although not shown in this figure, for each of the other output circuits 7b through 7e also, the selector 13 has the same circuit construction as the output circuit 7a. For the other output circuits 7b through 7e also, the selector 13 outputs first driving command signals Db through De, second driving command signals Eb through Ee and output mode setting signals Cb through Ce in the same way as that described in the above [1] through [3].

As shown in FIG. 1, for each of the output circuits 7a through 7e the electrical load driving device 1 has a pair of output terminals providing a high-potential side terminal 20 and a low-potential side terminal 22.

When the load 5a is to be driven by the output circuit 7a from the high side, as shown in FIG. 1, the negative (−) side terminal of the load 5a is connected to a ground potential (low-potential side of the load power supply, that is, the potential of the negative terminal of the battery). The positive (+) terminal of the load 5a is connected to the low-potential side terminal 22 serving the output circuit 7a. The high-potential side terminal 20 is connected to the battery voltage VB. In this case, a driving current flows out to the load 5a from the low-potential side terminal 22.

When the load 5e is to be driven by the output circuit 7e from the lowside, as shown in FIG. 1, the positive side terminal of the load 5e is connected to the battery voltage VB. The negative side terminal of the load 5e is connected to the high-potential side terminal 20. The low-potential side terminal 22 is connected to the ground potential. In this case, a driving current is drawn from the load 5e side to the high-potential side terminal 20.

The external connections of the electrical load driving device 1 in FIG. 1 show a case, wherein the three loads 5a through 5c are driven from the high side by the output circuits 7a through 7c and the other two loads 5d and 5e are driven from the low side by the output circuits 7d and 7e.

Figure 3:
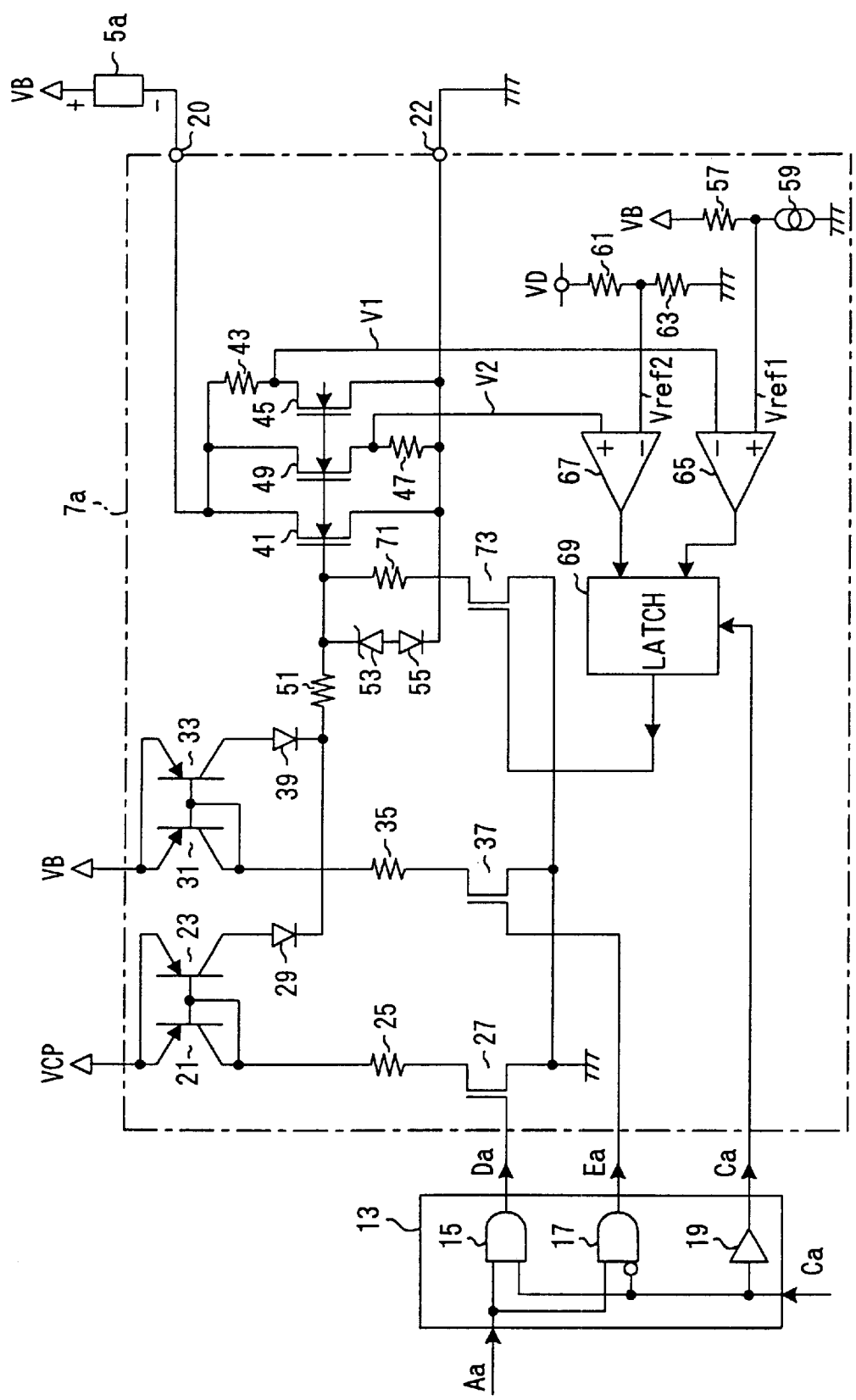
FIG. 3 is a circuit diagram showing the output circuit used in the embodiment to operate in a low-side output mode.

As shown in FIG. 2 and FIG. 3, the output circuit 7a has a PNP transistor 21, a PNP transistor 23, a resistor 25, a N-channel MOSFET 27, a diode 29. The PNP transistor 21 has its emitter which receives the boosted voltage VCP outputted from the charge pump circuit 9, and its base and its collector connected commonly. The PNP transistor 23 has its emitter and its base connected respectively to the emitter and the base of the PNP transistor 21, and forms a current mirror circuit with the PNP transistor 21. The resistor 25 has one end connected to the collector of the PNP transistor 21. The N-channel MOSFET 27 has its drain connected to the other end of the resistor 25, its source connected to the ground potential, and its gate which receives the first driving command signal Da from the selector 13. The diode 29 has its anode connected to the collector of the PNP transistor 23.

The output circuit 7a also has a PNP transistor 31, a PNP transistor 33, a resistor 35 and a diode 39. The PNP transistor 31 has its emitter which receives the battery voltage VB, and has its base and collector connected commonly. The PNP transistor 33 has its emitter and base connected respectively to the emitter and the base of the PNP transistor 31, and forms a current mirror circuit with the PNP transistor 31. The resistor 35 has one end connected to the collector of the PNP transistor 31. The N-channel MOSFET 37 has its drain connected to the other end of the resistor 35, its source connected to the ground potential, and its gate which receives the second driving command signal Ea from the selector 13. The diode 39 has its anode connected to the collector of the PNP transistor 33, and its cathode connected commonly to the cathode of the diode 29.

The output circuit 7a also has an N-channel power MOSFET 41, a first resistor 43, a first MOSFET 45, a resistor 47 and a second MOSFET 49. The MOSFET 41 serving as an output transistor has its drain constituting a first output terminal connected to the high-potential side terminal 20, and its source constituting a second output terminal connected to the low-potential side terminal 22. The first resistor 43 for current detection has one end connected to the drain of the FET 41. The first MOSFET 45 for current detection (first transistor for current detection) has its drain which is one of its output terminals connected to the other end of the first resistor 43 for current detection, its source which is its other output terminal connected to the source of the FET 41, and its gate connected commonly to the gate of the FET 41. The MOSFET 45 passes through the first resistor 43 a mirror current of 1/N (where n is a number greater than 1) of the current flowing through the FET 41. The second resistor 47 for current detection has one end connected to the source of the FET 41. The second MOSFET 49 for current detection (a second transistor for current detection) has its drain which is one of its output terminals connected to the drain of the FET 41, its source which is its other output terminal connected to the other end of the second resistor 47 for current detection and its gate connected commonly to the gate of the FET 41. The MOSFET 49 passes through the second resistor 47 for current detection a mirror current of 1/N (where N is a number greater than 1) of the current flowing through the FET 41.

The output circuit 7a also has a gate-protecting resistor 51, a Zener diode 53 and a diode 55. The resistor 51 is connected between the cathodes of the two diodes 29, 39 and the gate of the FET 41. The Zener diode 53 has its cathode connected to the gate of the FET 41. The diode 55 has its anode connected to the anode of the Zener diode 53 and its cathode connected to the source of the FET 41. The Zener diode 53 is provided to prevent an over-voltage from being applied to the gate of the FET 41. The diode 55 is provided to prevent the gate-source of the FET 41 from becoming reverse-biased.

The output circuit 7a also has a resistor 57, a constant current circuit 59, a resistor 61, a resistor 63, two comparators 65, 67 and a latch circuit 69. The resistor 57 has one end connected to the battery voltage VB. The constant current circuit 59 is connected between the other end of the resistor 57 and the ground potential for passing a predetermined constant current through the resistor 57. The resistor 61 has one end connected to a fixed voltage VD (5V) generated by a power supply part (not shown). The resistor 63 is connected between the other end of the resistor 61 and the ground potential. The resistors 61 and 63 divide the fixed voltage VD.

The comparator 65 compares the voltage (first current detection signal) V1 of the connection point between the drain of the first MOSFET 45 and the first resistor 43 with the voltage (first over-current determination voltage) Vref1 of the connection point between the resistor 57 and the constant current circuit 59. The comparator 65 outputs a high-level signal when the voltage V1 falls below the voltage Vref1.

The comparator 67 compares the voltage (second current detection signal) V2 of the connection point between the source of the second MOSFET 49 and the second resistor 47 with the voltage (second over-current determination voltage) Vref2 of the connection point between the resistor 61 and the resistor 63. The comparator 67 outputs a high-level signal when the voltage V2 rises above the voltage Vref2.

The latch circuit 69 latches and outputs the high-level signal from the comparator 65 when the output mode setting signal Ca from the selector 13 is high-level, indicating the high-side output mode. It also latches and outputs the high-level signal from the comparator 67 when the output mode setting signal Ca is low-level, indicating the low-side output mode.

The output circuit 7a also has a resistor 71 and a N-channel MOSFET 73. The resistor 71 has one end connected to the gate of the FET 41. The N-channel MOSFET 73 for over-current protection has its source connected to the ground potential, and its gate connected to the output terminal of the latch circuit 69.

In the output circuit 7a, when the load 5 (5a) is driven from the high side, that is, when the high-side output mode is used, as shown in FIG. 2, the drain of the FET 41 is connected via the high-potential side terminal 20 to the battery voltage VB. The source of the FET 41 is connected via the low-potential side terminal 22 to the positive side terminal of the load 5, whose negative side terminal is connected to the ground. In this connection state, the FET 41 functions as high-side driving means.

In this case, of the bits of the command signal B outputted from the microcomputer 3 to the output mode storage circuit 11, the bit corresponding to the output circuit 7a is set to "1" which indicates the high-side output mode. Along with this, the output mode setting signal Ca of the output circuit 7a outputted from the output mode storage circuit 11 to the selector 13 becomes high-level.

Then, whereas the second driving command signal Ea outputted from the selector 13 to the output circuit 7a is fixed at low-level, the first driving command signal Da outputted from the selector 13 to the output circuit 7a assumes the same logical level as the driving signal Aa from the microcomputer 3.

Consequently, in the output circuit 7a, whereas the FET 37 becomes unconditionally turned off, the FET 27 turns on in accordance with the driving signal Aa from the microcomputer 3 when that driving signal Aa is high-level.

When the FET 27 turns on, the two transistors 21, 23 forming the current mirror circuit turn on, the boosted voltage VCP from the charge pump circuit 9 is supplied from the collector of the PNP transistor 23 to the gate of the FET 41 by way of the diode 29 and the gate-protecting resistor 51. The FET 41 thus turns on. That is, when the driving signal Aa from the microcomputer 3 becomes high-level, the boosted voltage VCP, which is about twice the battery voltage VB, is supplied to the gate of the FET 41 connected to the high side of the load 5, that is, the higher potential side of the load 5. The FET 41 thus turns on. When the FET 41 turns on, a driving current flows out from the source of the FET 41 to the load 5 via the low-potential side terminal 22.

Here, when the FET 41 functions as high-side driving means like this, the voltage V1 (first detection voltage V1)

of the connection point between the drain of the first MOSFET 45 for current detection and the first resistor 43 for current detection becomes a voltage dropped from the battery voltage VB by a voltage proportional to the current Iout flowing through the FET 41. The first detection voltage V1 becomes as given by following equation (1). Here, R43 is a resistance of the first resistor 43, and n is the ratio of the current Iout flowing through the FET 41 to the current flowing through the first MOSFET 45, that is, the mirror ratio of the FET 41 to the FET 45.

$$V1 = VB - Iout \times R43/n \qquad (1)$$

In the output circuit 7a, if the resistance of the resistor 57 is R57 and the constant current flowing through the resistor 57 by the constant current circuit 59 is Icnst, then the voltage Vref1 (first determination voltage Vref1) of the connection point between the resistor 57 and the constant current circuit 59 is a voltage (=VB−Icnst×R57) dropped from the battery voltage VB by the fixed voltage Icnst×R57. If the over-current determination value of the current Iout flowing through the FET 41 is Ith, then the resistance R57 of the resistor 57 and the constant current Icnst are set so that the first determination voltage Vref1 satisfies the following equation (2).

$$Vref1 = VB - Ith \times R43/n \qquad (2)$$

When the FET 41 functions as high-side driving means, the output mode setting signal Ca from the selector 13 to the output circuit 7a becomes high-level. The latch circuit 69 latches and outputs the high-level signal from the comparator 65.

Consequently, when due to a failure such as shorting of the load 5 (for example, shorting of the low-potential side terminal 22 to the ground) the current Iout flowing through the FET 41 rises above the over-current detection value Ith and the first detection voltage V1 falls below the first determination voltage Vref1 and a high-level signal is outputted from the comparator 65, the output of the latch circuit 69 becomes high-level. The over-current protection FET 73 turns on. The gate of the FET 41 thus forcibly becomes low-level and the FET 41 turns off. By this operation, failure of the FET 41 caused by over-current when the FET 41 functions as high-side driving means is prevented.

When on the other hand the output circuit 7a drives the load 5 from the low side, that is, when it is used in the low-side output mode, as shown in FIG. 3, the drain of the FET 41 is connected via the high-potential side terminal 20 to the negative side terminal of the load 5 whose positive side terminal is connected to the battery voltage VB. The source of the FET 41 is connected via the low-potential side terminal 22 to the ground potential. In this connection state, the FET 41 functions as low-side driving means.

In this case, of the bits of the command signal B outputted from the microcomputer 3 to the output mode storage circuit 11, the bit corresponding to the output circuit 7a is set to "0" which indicates the low-side output mode. Along with this, the output mode setting signal Ca of the output circuit 7a outputted from the output mode storage circuit 11 to the selector 13 becomes low-level.

Then, whereas the first driving command signal Da outputted from the selector 13 to the output circuit 7a is fixed at low-level, the second driving command signal Ea outputted from the selector 13 to the output circuit 7a assumes the same logical level as the driving signal Aa from the microcomputer 3.

Consequently, in the output circuit 7a, whereas the FET 27 becomes unconditionally turned off, the FET 37 turns on in accordance with the driving signal Aa from the microcomputer 3 when that driving signal Aa is high-level.

When the FET 37 turns on, the two transistors 31, 33 forming the current mirror circuit turn on. The battery voltage VB is supplied from the collector of the transistor 33 to the gate of the FET 41 by way of the diode 39 and the resistor 51, and the FET 41 turns on. That is, when the driving signal Aa from the microcomputer 3 becomes high-level, the battery voltage VB is supplied to the gate of the FET 41 connected to the low side of the load 5, that is, the lower potential side of the load 5. Thus, the FET 41 turns on. When the FET 41 turns on, a driving current is drawn from the load 5 via the high-potential side terminal 20 to the drain of the FET 41.

Here, when the FET 41 functions as low-side driving means, the voltage V2 (second detection voltage V2) of the connection point between the source of the second MOSFET 49 for current detection and the second resistor 47 for current detection becomes a voltage raised from the ground potential (=0V) by a voltage proportional to the current Iout flowing through the FET 41.

Specifically, the second detection voltage V2 becomes as shown by the following expression (3). Here, R47 is a resistance of the second resistor 47 and N is the ratio of the current Iout flowing through the FET 41 to the current flowing through the second MOSFET 49, that is, a mirror ratio of the FET 41 to the FET 49.

$$V2 = Iout \times R47/N \qquad (3)$$

In the output circuit 7a, the voltage Vref2 (second determination voltage Vref2) of the connection point between the resistor 61 and the resistor 63 is a 5V constant voltage VD divided by the resistors 61 and 63. If the resistance of the resistor 61 is R61 and the resistance of the resistor 63 is R63, the second determination voltage Vref2 is a voltage raised from the ground potential by the fixed voltage VD×R63/(R61+R63). If the over-current detection value of the current Iout flowing through the FET 41 is Ith, the resistances R61, R63 of the resistors 61, 63 are set so that the second determination voltage Vref2 satisfies the following equation (4).

$$Vref2 = Ith \times R47/N \qquad (4)$$

When the FET 41 functions as low-side driving means, the output mode setting signal Ca from the selector 13 to the output circuit 7a becomes low-level. The latch circuit 69 latches and outputs the high-level signal from the comparator 67.

Consequently, when due to a failure such as shorting of the load 5 (for example, shorting of the high-potential side terminal 20 to the battery voltage VB), the current Iout flowing through the FET 41 rises above the over-current detection value Ith, the second detection voltage V2 rises above the second determination voltage Vref2 and a high-level signal is outputted from the comparator 67, the output of the latch circuit 69 becomes high-level and the over-current protection FET 73 turns on. The the gate of the FET 41 is forcibly brought down to low-level and the FET 41 is turned off. By this operation, failure of the FET 41 caused by over-current when the FET 41 functions as low-side driving means is prevented.

In the embodiment, the selector 13, the FETs 27, 37, the resistors 25, 35, the transistors 21, 23, 31, 33 and the diodes 29, 39 operate to switch output modes. The first resistor 43 for current detection and the first MOSFET 45 for current detection 45 operate to generate the first current detection signal. The resistor 57 and the constant current circuit 59 operate to generate the first over-current determination voltage. The second resistor 47 for current detection and the second MOSFET 49 for current detection operate to generate the second current detection signal. The resistor 61 and the resistor 63 operate to generate the second over-current determination voltage. The comparators 65, 67 and the latch circuit 69 operate to output the over-current detection signal. The high-level signal outputted from the latch circuit 69 is the over-current detection signal. The resistor 71 and the FET 73 operate to protect from the over-current.

In the above embodiment, when the FET 41 serving as the output transistor is functioning as high-side driving means, the first detection voltage V1 which from a battery voltage VB as a reference decreases in proportion to the current Iout flowing through the FET 41 and the first determination voltage Vref1 lower than the battery voltage VB by the fixed voltage (=Ith×R43/n) are compared to detect any over-current through the FET 41. Conversely, when the FET 41 is functioning as low-side driving means, the second detection voltage V2 which from the ground potential as a reference increases in proportion to the current Iout flowing through the FET 41 and the second determination voltage Vref2 higher than the ground potential by a fixed voltage (=Ith×R47/N) are compared to detect any over-current through the FET 41. Consequently, in the cases of both the high-side output mode and the low-side output mode, the over-current state of the FET 41 can be detected correctly on the basis of the first detection voltage V1 or the second detection voltage V2 proportional with the current Iout actually flowing through the FET 41, even if the battery voltage VB fluctuates. In particular, the over-current detection becomes possible even when the battery voltage VB fluctuates in the case of the high-side output mode, and the ground potential fluctuates affected by noise and the like in the case of the low-side output mode.

In the above embodiment, because the FET 41 is forced to be turned off when the over-current is detected, failure of the FET 41 caused by the over-current accompanying shorting of the load 5 can be certainly prevented.

Further, because the first detection voltage V1 and the second detection voltage V2 can both be generated without circuit elements for current detection such as shunt resistors being provided in series in the current supply path to the load 5, there is no fall in the voltage applied to the load 5 and no consequent raising of the minimum battery voltage below which driving of the load 5 is impossible.

The above embodiment may be modified in many ways.

For example, whereas the electrical load driving device 1 of the preferred embodiment described above had five output circuits 7a through 7e, the number of output circuits is not limited to five and may for example be one or two. If it is not expected that all of the output circuits 7a through 7e will be used in the high-side output mode at the same time, the output capacity of the boosted voltage VCP of the charge pump circuit 9 may be set to a minimum value needed to supply driving voltages, that is, gate voltages for turning on the FETs 41 of the maximum number of output circuits which are used in the high-side output mode simultaneously. A single comparator can be used for the over-current determination comparators 65, 67. In this case, a changeover switch is provided to switch the input of the comparator in accordance with the output mode setting signal Ca between the first detection voltage V1 and first determination voltage Vref1 and the second detection voltage V2 and the second determination voltage Vref2. Further, the detection voltages V1 and V2 and the outputs of the latch circuits 69 may be outputted from the output circuits 7a through 7e to the microcomputer 3 as monitor signals.

Still further modifications may be made without departing from the spirit of the invention.

What is claimed is:

1. An electrical load driving device comprising:
   an output transistor having a first output terminal and a second output terminal connected in series in an electrical current supply path for passing a driving current through an electrical load, the output transistor supplying the driving current to the electrical load by assuming an ON state;
   in accordance with an output mode setting signal, the output transistor being caused to function either as high-side driving means which, with the first output terminal connected to the high-potential side of a load power supply and the second output terminal connected to one terminal of the electrical load having its other terminal connected to the low-potential side of the load power supply, by assuming the ON state in accordance with a driving signal, passes the driving current to the electrical load, or being caused as low-side driving means which, with the first output terminal connected to the one terminal of the electrical load having its other terminal connected to the high-potential side of the load power supply and the second output terminal connected to the low-potential side of the load power supply, by assuming the ON state in accordance with the driving signal, draws the driving current from the electrical load;
   first current detection signal generating means for generating as a first current detection signal a voltage dropped from the high-potential side of the load power supply by a voltage proportional to the driving current flowing through the output transistor, when the output transistor is functioning as the high-side driving means;
   first over-current determination voltage generating means for generating as a first over-current determination voltage, the first over-current determination voltage to be compared with the first current detection signal, a voltage dropped from the high-potential side of the load power supply by a predetermined voltage;
   second current detection signal generating means for generating as a second current detection signal a voltage raised from the low-potential side of the load power supply by a voltage proportional to the driving current flowing through the output transistor, when the output transistor is functioning as the low-side driving means;
   second over-current determination voltage generating means for generating as a second over-current determination voltage, the second over-current determination voltage to be compared with the second current detection signal, a voltage raised from the low-potential side of the load power supply by a predetermined voltage; and
   over-current detection signal outputting means for comparing the first current detection signal with the first over-current determination voltage and outputting an over-current detection signal indicating that the driving current flowing through the output transistor is excessive when the first current detection signal falls below the first over-current determination voltage when the output transistor is being caused to function as the high-side driving means, and for comparing the second current detection signal with the second over-current determination voltage and outputting the over-current detection signal when the second current detection signal rises above the second over-current determination voltage when the output transistor is being caused to function as the lowside driving means.

2. An electrical load driving device as in claim 1, further comprising:

over-current protection means for forcibly turning off the output transistor when the over-current detection signal is outputted from the over-current detection signal outputting means.

3. An electrical load driving device as in claim 1, wherein:

the first current detection signal generating means includes a first resistor for current detection having one end connected to the first output terminal of the output transistor, and a first transistor for current detection having a first output terminal connected to the other end of the first resistor and another output terminal connected to the second output terminal of the output transistor for passing through the first resistor a mirror current proportional to the driving current flowing through the output transistor, and the first current detection signal generating means outputting as the first current detection signal the voltage of a connection point between the first output terminal of the first transistor and the first resistor; and the second current detection signal generating means includes a second resistor for current detection having one end connected to the second output terminal of the output transistor, and a second transistor for current detection having a first output terminal connected to the first output terminal of the output transistor and another output terminal connected to the other end of the second resistor for current detection for passing through the second resistor a mirror current proportional to the driving current flowing through the output transistor, the second current detection signal generating means outputting as the second current detection signal the voltage of a connection point between the other output terminal of the second transistor for current detection and the second resistor.

4. An electrical load driving device as in claim 1, wherein:

the output transistor, the first current detection signal generating means, the second current detection signal generating means and the over-current detection signal outputting means are formed as an output circuit in a single semiconductor integrated circuit.

5. An electrical load driving device as in claim 4, wherein the electrical load driving device further comprises an additional output circuit formed in the single semiconductor integrated circuit, the additional output circuit including an additional output transistor, an additional first current detection signal generating means, an additional second current detection signal generating means and an additional over-current detection signal outputting means.

6. An electrical load driving device comprising:

an output transistor having a first output terminal and a second output terminal connected in series in an electrical current supply path for passing a driving current through an electrical load, the output transistor supplying the driving current to the electrical load by assuming an ON state;

in accordance with an output mode setting signal, the output transistor being caused to function either as high-side driving means which, with the first output terminal connected to the high-potential side of a load power supply and the second output terminal connected to one terminal of the electrical load having its other terminal connected to the low-potential side of the load power supply, by assuming the ON state in accordance with a driving signal, passes the driving current to the electrical load, or being caused to function as low-side driving means which, with the first output terminal connected to the one terminal of the electrical load having its other terminal connected to the high-potential side of the load power supply and the second output terminal connected to the low-potential side of the load power supply, by assuming the ON state in accordance with the driving signal, draws the driving current from the electrical load;

current detection signal generating means for generating a current detection voltage signal indicative of the driving current flowing in the output transistor, when the output transistor is functioning in either one of a mode in which the output transistor is caused to function as the high-side driving means or a mode in which the output transistor is caused to function as the low-side driving means;

over-current determination voltage generating means for generating an over-current determination voltage to be compared with the current detection voltage signal; and over-current detection means for comparing the current detection voltage signal with the over-current determination voltage and outputting an over-current detection signal indicating that the driving current flowing through the output transistor is excessive whether the output transistor is caused to function as the high-side driving means or the low-side driving means.

7. An electrical load driving device as in claim 6, wherein the over-current detection means is responsive to the output mode setting signal that determines the output transistor to operate as one of the high-side driving means and the low-side driving means.

8. A method of driving an electrical load, the method comprising:

providing an output transistor having a first output terminal and a second output terminal connected in series in an electrical current supply path for passing a driving current through the electrical load, the output transistor supplying the driving current to the electrical load by assuming an ON state;

in accordance with an output mode setting signal, causing the output transistor to function either as a high-side driver which, with the first output terminal connected to the high-potential side of a load power supply and the second output terminal connected to one terminal of the electrical load having its other terminal connected to the low-potential side of the load power supply, by assuming the ON state in accordance with a driving signal, passes the driving current to the electrical load, or causing the output transistor to function as a low-side driver which, with the first output terminal connected to the one terminal of the electrical load having its other terminal connected to the high-potential side of the load power supply and the second output terminal connected to the low-potential side of the load power supply, by assuming the ON state in accordance with the driving signal, draws the driving current from the electrical load;

generating as a first current detection signal a voltage dropped from the high-potential side of the load power supply by a voltage proportional to the driving current flowing through the output transistor, when the output transistor is functioning as the high-side driver;

generating as a first over-current determination voltage, the first over-current determination voltage to be compared with the first current detection signal, a voltage dropped from the high-potential side of the load power supply by a predetermined voltage;

generating as a second current detection signal a voltage raised from the low-potential side of the load power supply by a voltage proportional to the driving current flowing through the output transistor, when the output transistor is functioning as the low-side driver;

generating as a second over-current determination voltage, the second over-current determination voltage to be compared with the second current detection signal, a voltage raised from the low-potential side of the load power supply by a predetermined voltage; and comparing the first current detection signal with the first over-current determination voltage and outputting an over-current detection signal indicating that the driving current flowing through the output transistor is excessive when the first current detection signal falls below the first over-current determination voltage when the output transistor is being caused to function as the high-side driver, and for comparing the second current detection signal with the second over-current determination voltage and outputting the over-current detection signal when the second current detection signal rises above the second over-current determination voltage when the output transistor is being caused to function as the low-side driver.

9. A method as in claim 8, further comprising:

forcibly turning off the output transistor when the over-current detection signal is output.

10. A method of driving an electrical load comprising:

providing an output transistor having a first output terminal and a second output terminal connected in series in an electrical current supply path for passing a driving current through the electrical load, the output transistor supplying the driving current to the electrical load by assuming an ON state;

in accordance with an output mode setting signal, causing the output transistor to function either as a high-side driver which, with the first output terminal connected to the high-potential side of a load power supply and the second output terminal connected to one terminal of the electrical load having its other terminal connected to the low-potential side of the load power supply, by assuming the ON state in accordance with a driving signal, passes the driving current to the electrical load, or causing the output transistor to function as a low-side driver which, with the first output terminal connected to the one terminal of the electrical load having its other terminal connected to the high-potential side of the load power supply and the second output terminal connected to the low-potential side of the load power supply, by assuming the ON state in accordance with the driving signal, draws the driving current from the electrical load;

generating a current detection voltage signal indicative of the current flowing in the output transistor, when the output transistor is functioning in either a mode in which the output transistor is caused to function as the high-side driver or a mode in which the output transistor is caused to function as the low-side driver;

generating an over-current determination voltage to be compared with the current detection voltage signal; and comparing the current detection voltage signal with the over-current determination voltage and outputting an over-current detection signal indicating that the driving current flowing through the output transistor is excessive.

* * * * *